(12) United States Patent
Watanabe et al.

(10) Patent No.: US 11,828,798 B2
(45) Date of Patent: Nov. 28, 2023

(54) TEST APPARATUS (71) Applicants: ADVANTEST CORPORATION, Tokyo (JP); TOEI SCIENTIFIC INDUSTRIAL CO., LTD., Sendai (JP)

(72) Inventors: Naoyoshi Watanabe, Tokyo (JP); Shigeyuki Sato, Sendai (JP); Ryoichi Utsumi, Sendai (JP)

(73) Assignees: ADVANTEST CORPORATION, Tokyo (JP); TOEI SCIENTIFIC INDUSTRIAL CO., LTD., Sendai (JP)

( * ) Notice: Subject to any disclaimer, the term of this patent is extended or adjusted under 35 U.S.C. 154(b) by 24 days.

(21) Appl. No.: 17/512,042

(22) Filed: Oct. 27, 2021

(65) Prior Publication Data

US 2022/0050138 A1 Feb. 17, 2022

Related U.S. Application Data (63) Continuation of application No. PCT/JP2020/046822, filed on Dec. 15, 2020.

(30) Foreign Application Priority Data

Feb. 10, 2020 (JP) .................... 2020-020832

(51) Int. Cl.
  *G01R 31/28* (2006.01)
  *G01R 33/02* (2006.01)
(52) U.S. Cl.
  CPC ..... *G01R 31/2889* (2013.01); *G01R 31/2863* (2013.01); *G01R 33/02* (2013.01)

(58) Field of Classification Search
  CPC .............. G01R 1/07307; G01R 1/07342
  See application file for complete search history.

(56) References Cited

U.S. PATENT DOCUMENTS

2013/0009659 A1\* 1/2013 Liu .................... G01R 1/07307
                                                              324/756.02
2019/0137543 A1\* 5/2019 Eo ........................ G01R 1/0491

FOREIGN PATENT DOCUMENTS

| JP | H04334077 A | 11/1992 |
|----|-------------|---------|
| JP | 2004151056 A | 5/2004 |
| JP | 2007024518 A | 2/2007 |

(Continued)

OTHER PUBLICATIONS

TIPO Decision of Refusal for corresponding TW Application No. 109147100; dated Dec. 20, 2021.

(Continued)

*Primary Examiner* — Tung X Nguyen
(74) *Attorney, Agent, or Firm* — CANTOR COLBURN LLP (57) ABSTRACT

The test apparatus tests a wafer under test on which devices under test each including magnetoresistive memory or a magnetic sensor are formed. In a test process, the wafer under test is mounted on a stage. A test probe card is configured such that it can make probe contact with the wafer under test in the test process. A wafer connection HiFix is arranged between the test probe card and a test head. A magnetic field application apparatus is provided to the wafer connection HiFix. In the test process, the magnetic field application apparatus applies a magnetic field $B_{EX}$ to the wafer under test.

4 Claims, 12 Drawing Sheets

(56) References Cited

FOREIGN PATENT DOCUMENTS

| JP | 2007147568 A | 6/2007 |
|----|--------------|--------|
| JP | 2008139305 A | 6/2008 |
| JP | 2012198102 A | 10/2012 |
| TW | 200613740 A | 5/2006 |
| TW | 201602607 A | 1/2016 |
| TW | 201939060 A | 10/2019 |

OTHER PUBLICATIONS

International Preliminary Report on Patentability with Written Opinion of the International Searching Authority for the Internatonal Patent Application No. PCT/JP2020/046822; dated Aug. 11, 2022.
International Search Report for International Application No. PCT/JP2020/046822; dated Mar. 2, 2021.
TIPO Notification of Reasons for Rejection for corresponding TW Application No. 109147100; dated Jul. 26, 2021.
KRPO Office Action for corresponding KR 10-2021-7033909; dated Apr. 7, 2023.
JPO Notification of Reasons for Refusal for corresponding JP Application No. 2020-020832; dated Jul. 25, 2023.

* cited by examiner

TEST APPARATUS

CROSS REFERENCE TO RELATED APPLICATIONS

This application is a continuation under 35 U.S.C. § 120 of PCT/JP2020/046822, filed Dec. 15, 2020, which is incorporated herein reference and which claimed priority to Japanese Application No. 2020-020832, filed Feb. 10, 2020. The present application likewise claims priority under 35 U.S.C. § 119 to Japanese Application No. 2020-020832, filed Feb. 10, 2020, the entire content of which is also incorporated herein by reference.

BACKGROUND

1. Technical Field

The present disclosure relates to a semiconductor test apparatus.

2. Description of the Related Art

As next-generation memory, Magnetoresistive Random Access Memory (MRAM) is being developed. Magnetoresistive random access memory records information using the magnetization state of a Magnetic Tunnel Junction (MTJ). This allows the magnetoresistive random memory to function as nonvolatile memory, unlike other kinds of memory that use the charge state, such as Static RAM (SRAM), Dynamic RAM (DRAM), or the like.

In order to write data to MRAM, there is a need to apply a magnetic field to an MTJ so as to change the magnetization state of the MTJ. In other words, if the magnetization state of the MTJ is changed due to an external magnetic field, this leads to data corruption. In order to solve such a problem, from now on, specifications will be defined that include the magnetic characteristics when an external magnetic field is applied or the like in addition to the electrical characteristics, and there is a need for MRAM to be tested with respect to the magnetic characteristics before assembly processing.

SUMMARY

The present disclosure has been made in view of such a situation.

An embodiment of the present disclosure relates to a test apparatus structured to test a wafer under test on which devices under test each including magnetoresistive memory or a magnetic sensor are formed. The test apparatus is a test apparatus structured to test a wafer under test on which devices under test each including magnetoresistive memory or a magnetic sensor are formed. The test apparatus includes: a test head; a stage on which the wafer under test is to be mounted in a test process; a test probe card structured to make probe contact with the wafer under test in the test process; a connection unit arranged between the test probe card and the test head; and a magnetic field application apparatus provided to the connection unit, and structured to apply a magnetic field to the wafer under test in the test process.

It is to be noted that any arbitrary combination or rearrangement of the above-described structural components and so forth is effective as and encompassed by the present embodiments. Moreover, all of the features described in this summary are not necessarily required by embodiments so that the embodiment may also be a sub-combination of these described features. In addition, embodiments may have other features not described above.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

An outline of several example embodiments of the disclosure follows. This outline is provided for the convenience of the reader to provide a basic understanding of such embodiments and does not wholly define the breadth of the disclosure. This outline is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

A test apparatus according to one embodiment tests a wafer under test on which devices under test each including magnetoresistive memory or a magnetic sensor are formed. The test apparatus is a test apparatus structured to test a wafer under test on which devices under test each including magnetoresistive memory or a magnetic sensor are formed. The test apparatus includes: a test head; a stage on which the wafer under test is to be mounted in a test process; a test probe card structured to make probe contact with the wafer under test in the test process; a connection unit arranged between the test probe card and the test head; and a magnetic field application apparatus provided to the connection unit, and structured to apply a magnetic field to the wafer under test in the test process.

The electromagnet generates a magnetic field with an intensity that changes according to the amount of current supplied. Accordingly, the electromagnet itself acts as a heat source, and has an effect on the surrounding temperature. With the present embodiment, the magnetic field application apparatus can be separated by means of the wafer from the stage to be temperature controlled.

In one embodiment, a control signal for the magnetic field application apparatus may be transmitted using an existing interface arranged between the test head and the connection unit. In a case in which the magnetic field application apparatus is arranged below or to the side of the stage, such an arrangement requires additional wiring or an interface for transmitting a control signal to the magnetic field application apparatus. In contrast, with such an arrangement using the existing interface, this allows the system to be designed in a simple manner.

In one embodiment, the magnetic field application apparatus may include: a core; a coil wound on the core; and a driving circuit structured to drive the coil. Also, the connection unit may further include an interface circuit structured to receive a control signal for the driving circuit from the test head.

In one embodiment, the magnetic field application apparatus may include a core and a coil wound on the core. Also, a driving circuit structured to drive the coil may be provided as an external component of the connection unit.

In one embodiment, the test apparatus may further include: a diagnostic wafer on which multiple magnetization detection units are formed, and structured to be capable of measuring a magnetic field generated by the magnetic field application apparatus by means of each magnetization detection unit in a state in which the diagnostic wafer is mounted on the stage instead of the wafer under test in a diagnostic process of the test apparatus; and a diagnostic probe card to be used in the diagnostic process instead of the test probe card, and structured to make probe contact with the diagnostic wafer.

The magnetization detection units formed on the diagnostic wafer are positioned at the same height as that of the devices under test formed on the wafer under test. Accordingly, such an arrangement provides high-precision measurement of an external magnetic field to be applied to the devices under test formed on the wafer under test by means of the magnetization detection units formed on the diagnostic wafer. The output of each magnetization detection unit is input to the test head via the diagnostic probe card. Subsequently, the outputs of the magnetization detection units can be effectively processed by the test head or the hardware components of the tester main body.

Embodiments

Description will be made below regarding preferred embodiments with reference to the drawings. In each drawing, the same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

Embodiment 1

Figure 1:
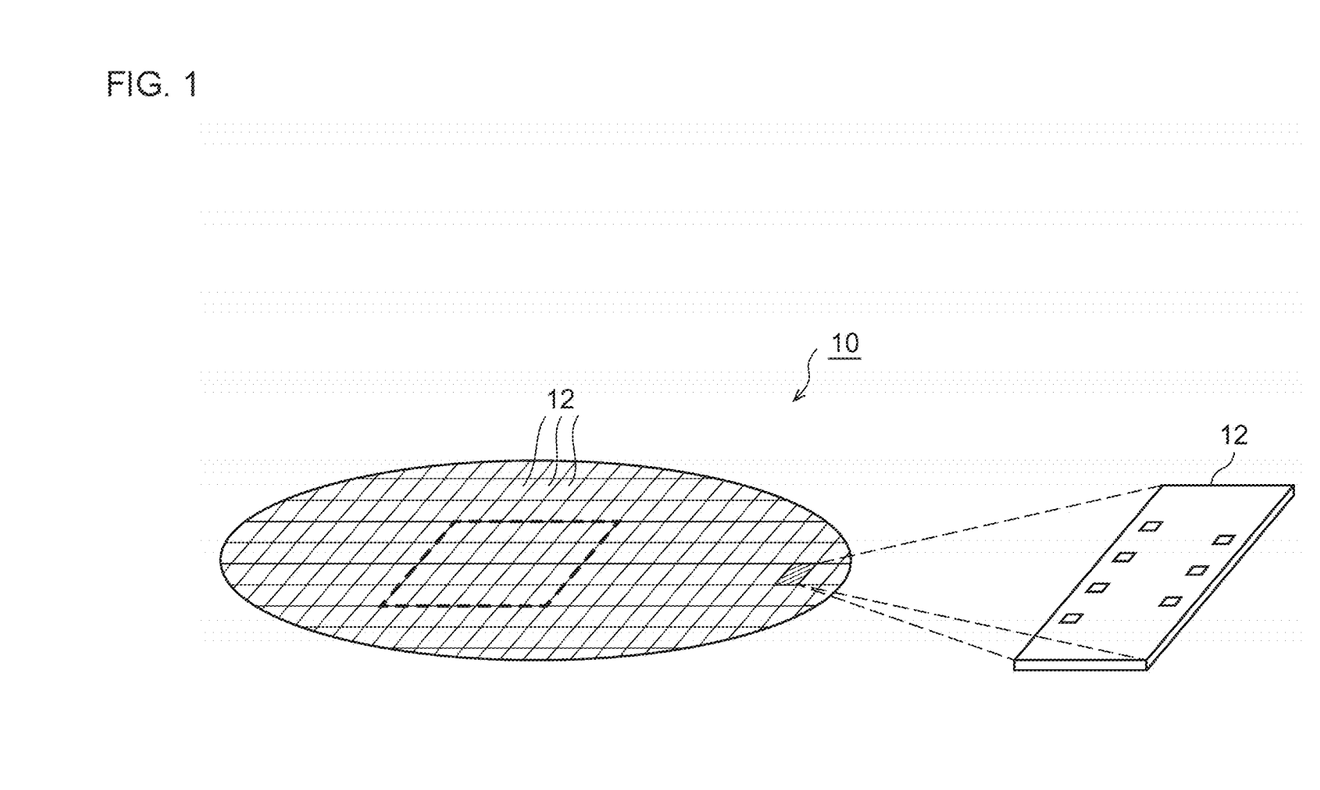
FIG. 1 is a diagram showing a wafer under test.

FIG. 1 is a diagram showing a wafer under test 10. Multiple devices under test 12 are formed on the wafer under test 10. After dicing, the multiple chips of the devices under test 12 are obtained. In the present embodiment, the device under test 12 is configured as MRAM. The device under test 12 includes an MTJ that forms a cell of the MRAM, a peripheral circuit thereof, and multiple contact pins (electrodes). The broken line 14 indicates the measurement area (which will be referred to as a "simultaneous measurement area") to be simultaneously measured by a test apparatus 100E described later. Typically, the test apparatus 100E simultaneously measures multiple (e.g., 256 or 128) devices under test 12.

Figure 2:
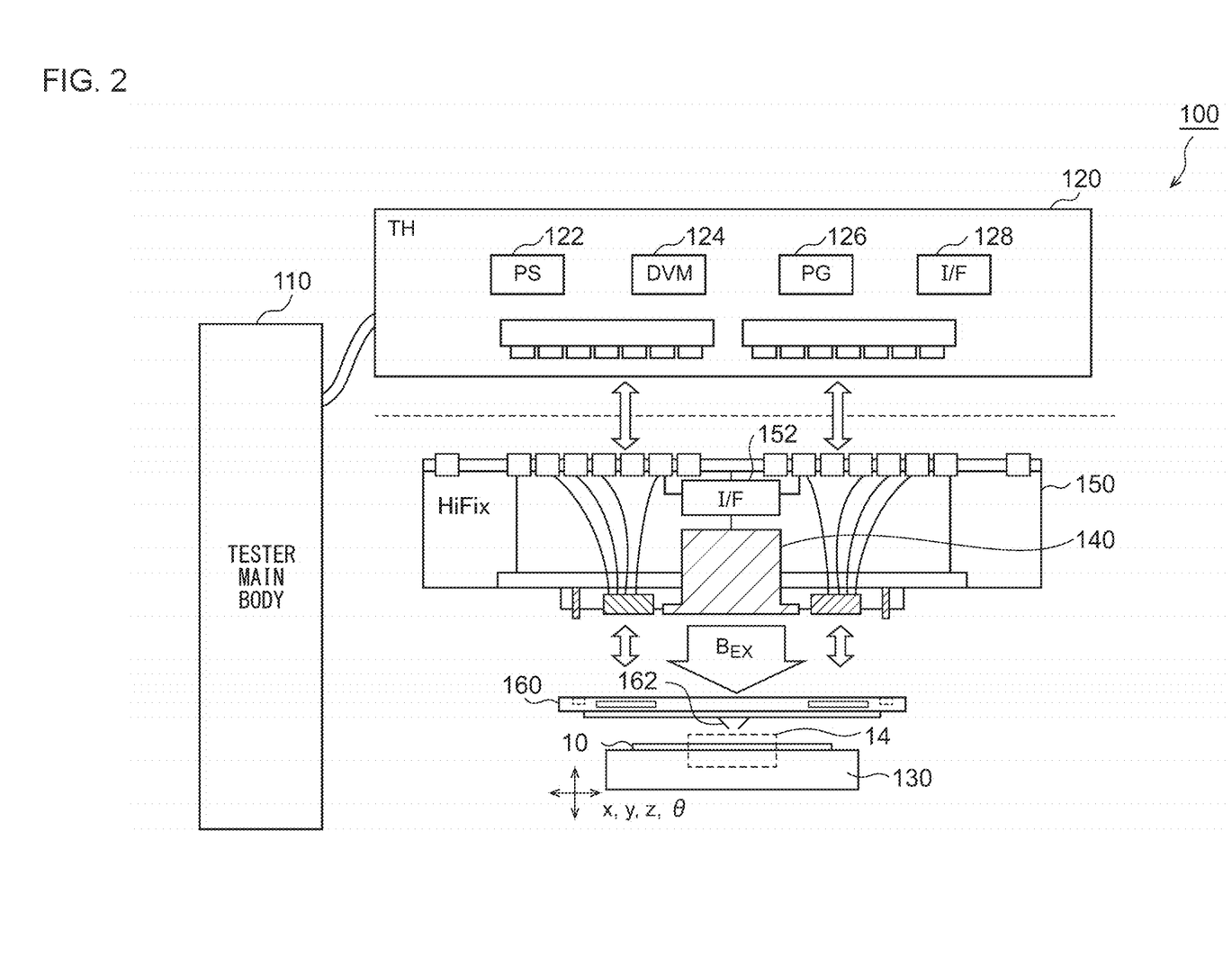
FIG. 2 is a block diagram showing a test apparatus according to an embodiment 1.

FIG. 2 is a block diagram showing a test apparatus 100E according to an embodiment 1. The test apparatus 100E is a wafer test apparatus configured to test the wafer under test 10 shown in FIG. 1. The test apparatus 100E includes a tester main body 110, a test head 120, a stage 130, a magnetic field application apparatus 140, a wafer connection HiFix 150, and a test probe card 160.

The tester main body 110 is provided with a processing device that executes a test program, and integrally controls the test apparatus 100E.

The test head 120 includes built-in hardware components such as a device power supply 122 that supplies electric power to the device under test 12, a voltage/current measurement device (DVM) 124, a pattern generator 126, etc. The hardware components are controlled by the tester main body 110. A part of the hardware components may be provided to the tester main body 110. An interface circuit (transceiver) 128 is configured to allow data to be transmitted to and received from an interface circuit 152 provided to the wafer connection HiFix 150. The kind of the interface circuit 128 is not restricted in particular. For example, various kinds of protocols such as Ethernet (trademark), Universal Serial Bus (USB), and so on may be employed.

The stage 130 is also referred to as a "chuck". In the test process, the wafer under test 10 is mounted on the stage 130. The stage 130 is configured such that it can be moved in the X, Y, and Z directions. Furthermore, the stage 130 may be configured such that it can be rotated in the θ direction around the Z axis.

In the test process, the magnetic field application apparatus 140 applies an external magnetic field $B_{EX}$ to the wafer under test 10. Specifically, the magnetic field application apparatus 140 is configured to apply a substantially uniform external magnetic field $B_{EX}$ to a simultaneous measurement area 14 of the wafer under test 10, i.e., to the multiple devices under test 12 included in the simultaneous measurement area 14. The configuration of the magnetic field application apparatus 140 is not restricted in particular. The magnetic field application apparatus 140 may be configured as an electromagnet that allows the magnitude or the waveform of the external magnetic field $B_{EX}$ to be electrically controlled.

As the MRAM, a type in which a vertical magnetic field is applied and a type in which a horizontal magnetic field is applied are known. The direction of the external magnetic field $B_{EX}$ to be generated by the magnetic field application apparatus 140 is determined according to the kind of the MRAM. Description will be made regarding an example in which the external magnetic field $B_{EX}$ is applied in a direction that is orthogonal to the wafer under test 10.

The test probe card 160 is also referred to as a "performance board". The test probe card 160 is configured such that it can make probe contact with respect to the wafer under test 10 in the test process. Specifically, the bottom face of the test probe card 160 is provided with multiple probe needles 162 structured such that they can be in contact with multiple pins provided to the wafer under test 10.

A connection unit (interface), which will be referred to as a "wafer connection HiFix 150" or "wafer connection High Fidelity Tester Access Fixture (HiFIX)", is provided between the test head 120 and the test probe card 160. A signal is transmitted between the test head 120 and the test probe card 160 via the wafer connection HiFix 150. In the present embodiment, the main part of the magnetic field application apparatus 140 is provided to the wafer connection HiFix 150. A control signal for the magnetic field application apparatus 140 can be transmitted by communication between the interface circuit 128 of the test head 120 and the interface circuit 152 of the wafer connection HiFix 150.

The above is the basic configuration of the test apparatus 100E. In a normal test process, while the external magnetic field $B_{EX}$ is applied by the magnetic field application apparatus 140 to a plurality of devices under test 12 included in the simultaneous measurement area 14, data writing and data reading are executed for each MRAM that is a device under test 12, so as to test whether or not the device under test 12 operates normally. Subsequently, the same processing is repeated while moving the position of the wafer under test 10 by means of the stage 130, thereby testing all the chips on the wafer under test 10.

Figure 3:
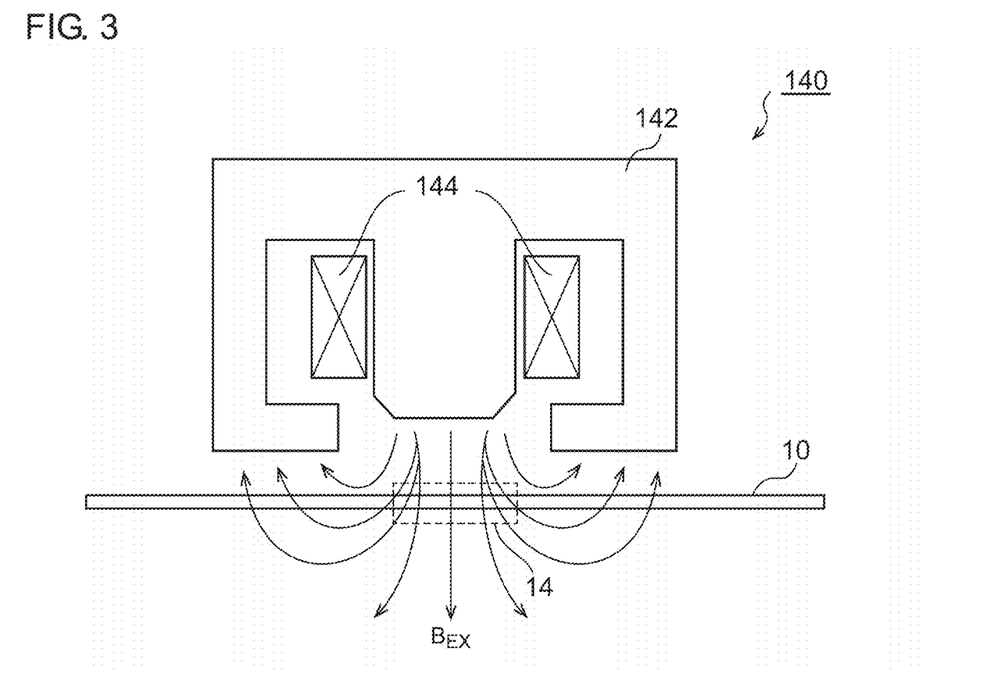
FIG. 3 is a cross-sectional diagram showing a magnetic field application apparatus.

FIG. 3 is a cross-sectional diagram showing the magnetic field application apparatus 140. The magnetic field application apparatus 140 includes a core 142 and a coil 144 wound on the core 142. With this configuration, this is capable of applying an external magnetic field $B_{EX}$ that is orthogonal to the wafer under test 10. As described above, the magnetic field application apparatus 140 is built into the wafer connection HiFix 150. In FIG. 3, the test probe card 160 is not shown.

Next, description will be made regarding the advantages of the test apparatus 100E.

With the present embodiment, the magnetic field application apparatus 140 is built into the wafer connection HiFix 150. In many test apparatuses, the temperature characteristics of the wafer under test 10 are tested, and the temperature of the stage 130 is dynamically controlled. The electromagnet that forms the magnetic field application apparatus 140 changes the magnetic field intensity according to the amount of current supplied. However, the electromagnet itself acts as a heat source. Accordingly, in a case in which the magnetic field application apparatus 140 is arranged in the vicinity of the temperature-controllable stage 130, such an arrangement has the potential to have an adverse effect on the temperature control operation of the stage 130. With the present embodiment using the test probe card 160 and the wafer under test 10 (or the diagnostic wafer 170 and the diagnostic probe card 180), this allows the magnetic field application apparatus 140 to be separated from the stage 130 that functions as a heat source. Accordingly, such an arrangement is resistant to the effects of heat.

Also, the magnetic field application apparatus 140 may be arranged below or to the side of the stage 130. In this case, such an arrangement requires an additional control line that allows the test head 120 to control the magnetic field application apparatus 140. In contrast, with the present embodiment in which the magnetic field application apparatus 140 is built into the wafer connection HiFix 150, this allows a control signal to be transmitted to the magnetic field application apparatus 140 using the existing interface circuits 128 and 152 arranged between the test head 120 and the wafer connection HiFix 150. This allows the system to be designed in a simple manner. Furthermore, the magnetic field application apparatus 140 can be handled in the same manner as the hardware components built into the test head 120. This allows control instructions to be supplied to the magnetic field application apparatus 140 to be written in a test program to be executed by the tester main body 110.

Figure 4:
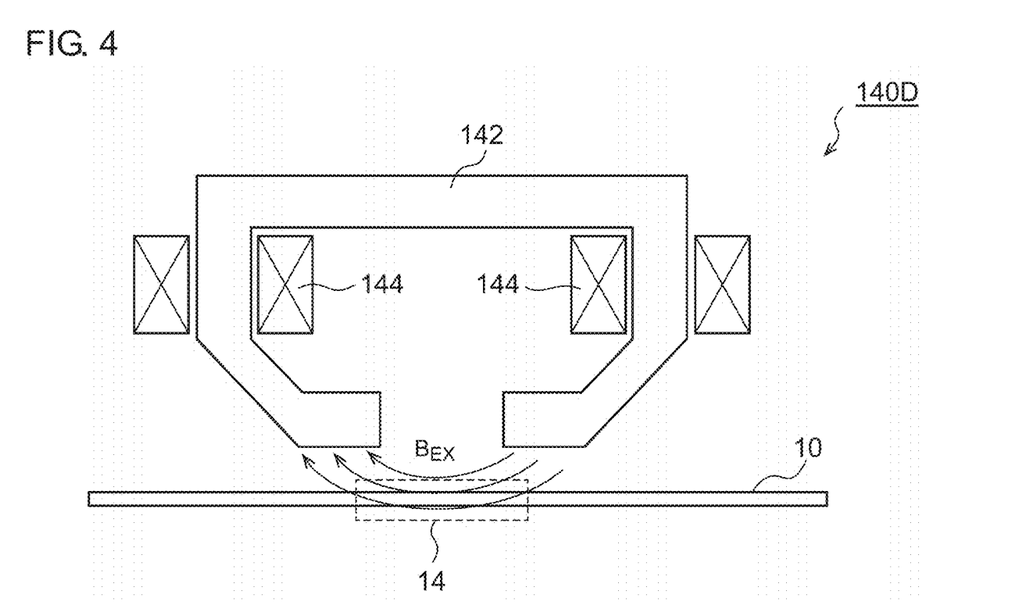
FIG. 4 is a cross-sectional diagram showing a magnetic field application apparatus according to a modification 1.

Description has been made regarding an arrangement in which the external magnetic field $B_{EX}$ is generated in a direction that is orthogonal to the wafer under test 10. However, the present invention is not restricted to such an arrangement. Also, the magnetic field application apparatus 140 may be configured to apply the external magnetic field $B_{EX}$ in an in-plane direction of the wafer under test 10. FIG. 4 is a cross-sectional diagram showing a magnetic field application apparatus 140D according to a modification 1. In FIG. 4, the test probe card 160 is not shown.

Embodiment 2

Figure 5:
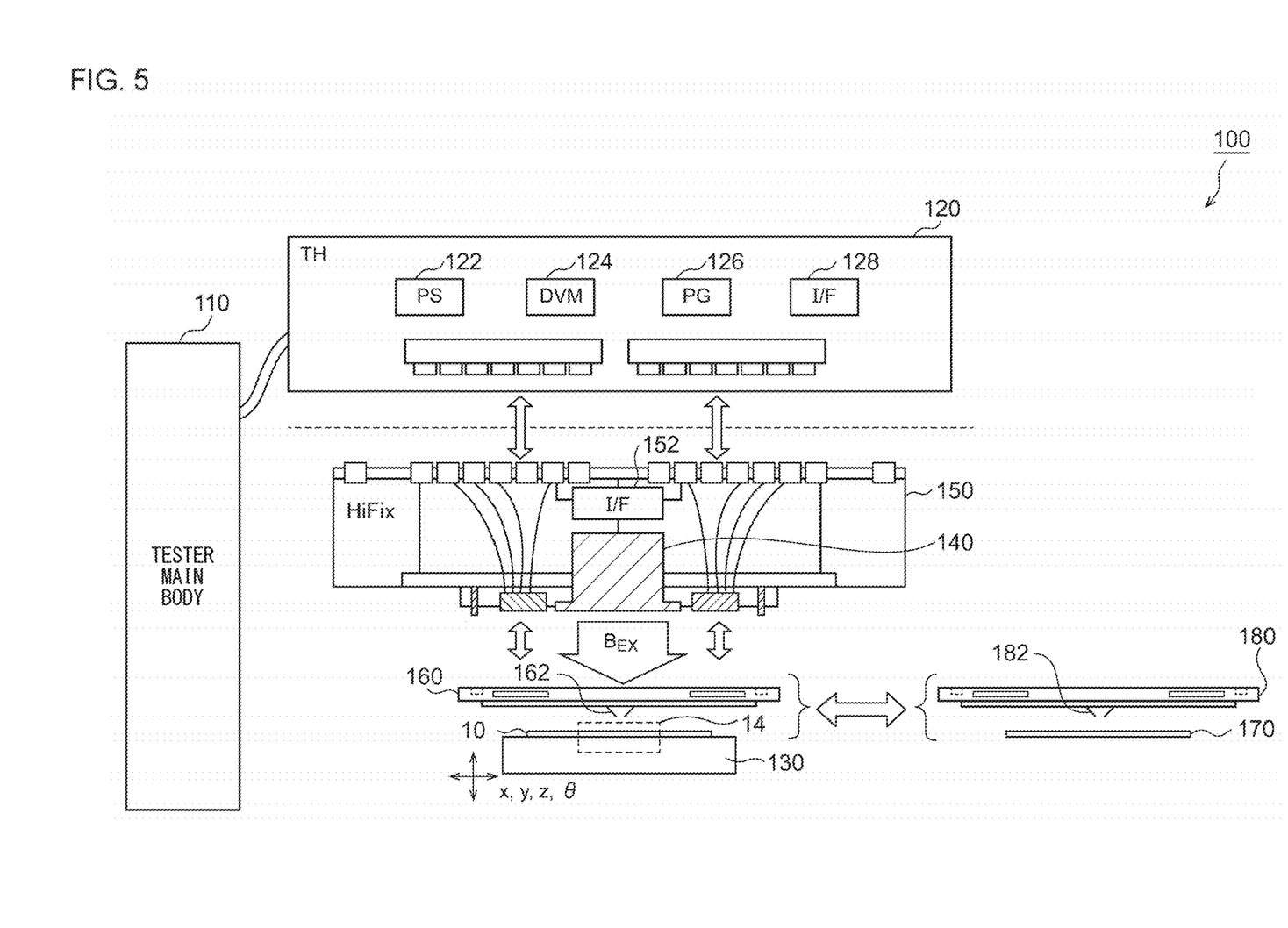
FIG. 5 is a diagram showing a test apparatus according to an embodiment 2.

FIG. 5 is diagram showing a test apparatus 100 according to an embodiment 2. The test apparatus 100 is configured to be capable of measuring the external magnetic field $B_{EX}$ generated by the magnetic field application apparatus 140 in a diagnostic process. In order to diagnose and calibrate the magnetic field application apparatus 140, the test apparatus 100 is used together with the diagnostic wafer 170 and the diagnostic probe card 180.

Figure 6:
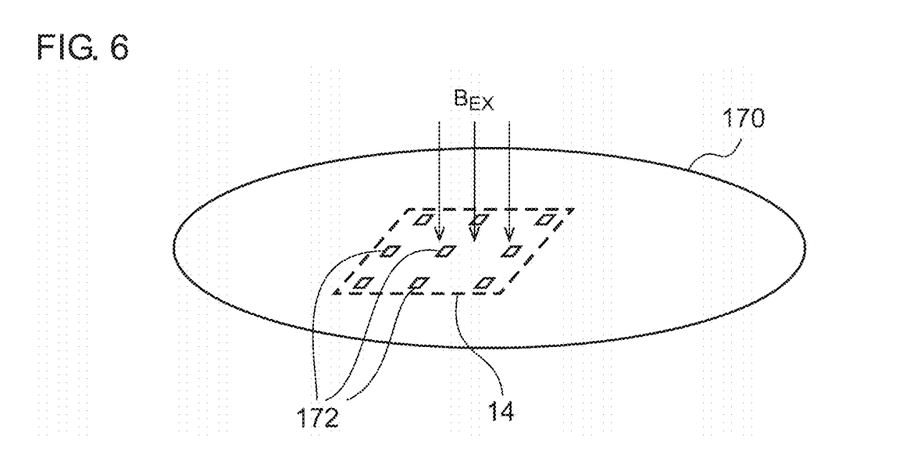
FIG. 6 is a diagram showing a diagnostic wafer.

FIG. 6 is a diagram showing the diagnostic wafer 170. In the diagnostic process of the test apparatus 100, the diagnostic wafer 170 is mounted on the stage 130 instead of the wafer under test 10. Multiple magnetization detection units 172 each configured to be capable of measuring the magnetic field $B_{EX}$ to be generated by the magnetic field application apparatus 140 are formed on the diagnostic wafer 170. In FIG. 6, the synchronous measurement area 14 is indicated by the broken line. It can be said that the synchronous measurement area 14 means an area that ensures that a uniform external magnetic field $B_{EX}$ can be applied. The material of the diagnostic wafer 170 is not restricted in particular. Various kinds of semiconductor substrates formed of silicon, SiC, GaN, or the like may be employed. Also, a substrate formed of a material that differs from a semiconductor material may be employed.

The multiple magnetization detection units 172 are arranged in the synchronous measurement area 14 or over an area that is wider than the synchronous measurement area 14, thereby allowing the external magnetic field $B_{EX}$ intensity distribution to be acquired. In this example, nine magnetization detection units 172 are shown. However, the number of the magnetization detection units 172 is not restricted in particular. In a case in which the external magnetic field $B_{EX}$ is to be detected with high spatial resolution, the number of the magnetization detection units 172 may preferably be increased. Otherwise, the number of the magnetization detection units 172 may be reduced.

Returning to FIG. 5, the diagnostic probe card 180 and the diagnostic wafer 170 are used as a set. In the diagnostic process, the diagnostic probe card 180 is mounted on the wafer connection HiFix 150 instead of the test probe card 160. The diagnostic probe card 180 is arranged such that it faces the diagnostic wafer 170. The diagnostic probe card 180 is configured so as to enable probe contact with the diagnostic wafer 170. Specifically, the bottom face of the diagnostic probe card 180 is provided with multiple probe needles 182 structured such that they can be in contact with multiple pins provided to the diagnostic wafer 170.

Figure 7:
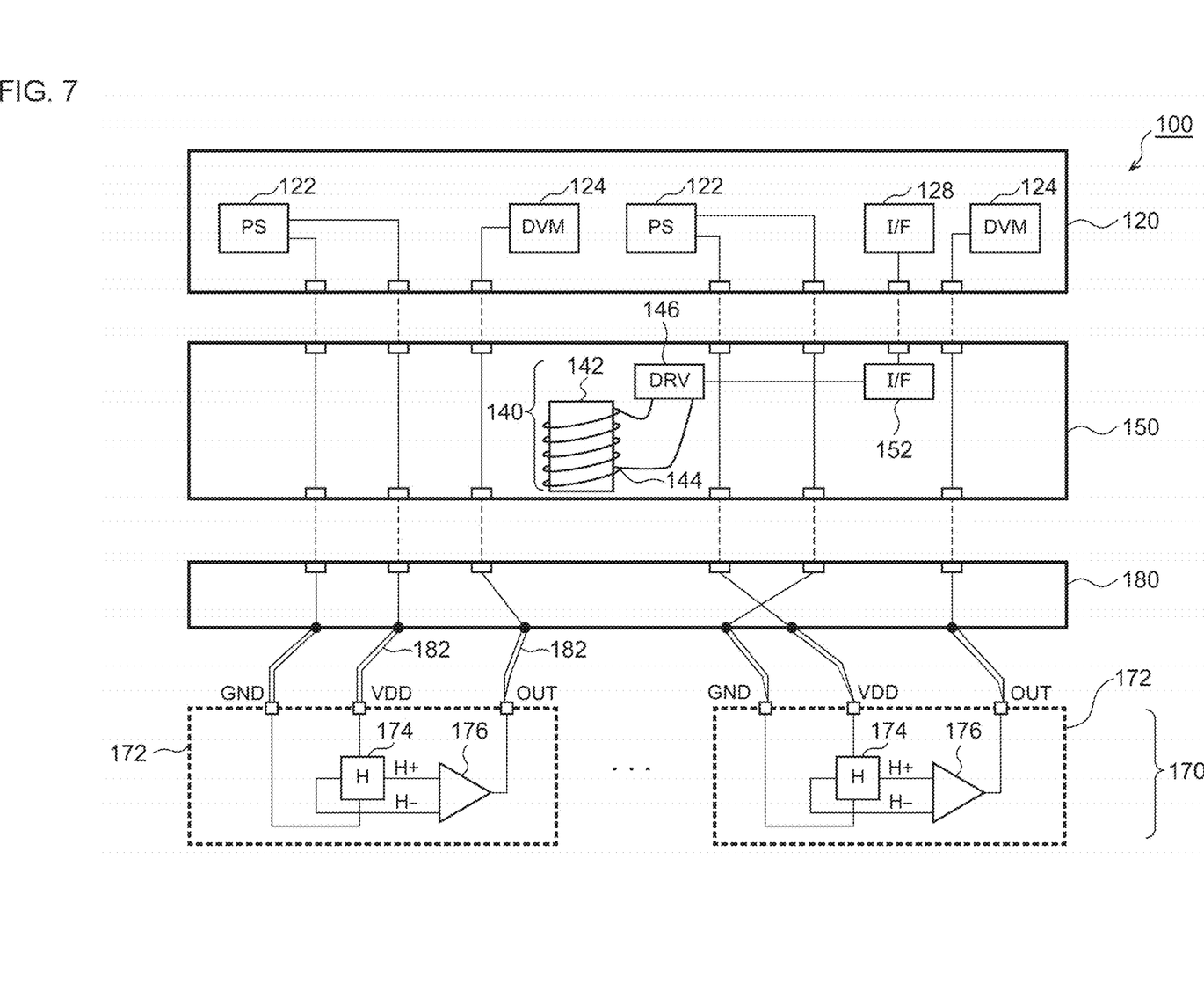
FIG. 7 is a diagram showing a configuration of the test apparatus in a diagnostic process.

FIG. 7 is a diagram showing a configuration of the test apparatus 100 in the diagnostic process. Multiple magnetization detection units 172 are formed on the diagnostic wafer 170. Each magnetization detection unit 172 has a three-terminal configuration (VDD, GND, OUT) including a magnetic sensor 174 and an amplifier 176 that amplifies the difference between Hall signals H+ and H−, which are outputs of the magnetic sensor 174. A power supply voltage generated by the device power supply 122 is supplied to the power supply pin VDD of the magnetization detection unit 172 via the wafer connection HiFix 150 and the diagnostic probe card 180. Furthermore, the ground voltage of the device power supply 122 is supplied to the ground pin VDD of the magnetization detection unit 172 via the wafer connection HiFix 150 and the diagnostic probe card 180. Moreover, a detection signal occurs at the output pin OUT of each magnetization detection unit 172 according to the external magnetic field $B_{EX}$ received by the magnetic sensor 174. The output pin OUT is coupled to the DVM 124 via the wafer connection HiFix 150 and the diagnostic probe card 180. With this, the detection signal is acquired in the form of a digital signal.

The wafer connection HiFix 150 is provided with the magnetic field application apparatus 140. It should be noted that the magnetic field application apparatus 140 is shown with a reduced scale because of space limitations. In actuality, the magnetic field application apparatus 140 has an area that covers the multiple magnetization detection units 172. The magnetic field application apparatus 140 includes a single core 142 or multiple cores 142, coils 144 each wound on the corresponding core 142, and a driving circuit 146. The driving circuit 146 receives a control signal supplied from the test head 120, and controls a current that flows through the coil 144 according to the control signal, so as to generate the external magnetic field $B_{EX}$.

In the diagnostic process, contact may be made simultaneously to all of the plurality of N magnetization detection units 172 formed on the diagnostic wafer 170. In this state, the external magnetic field $B_{EX}$ may be measured for all the N points simultaneously by means of all N magnetization detection units 172. Alternatively, instead of such a measurement in which the external magnetic field $B_{EX}$ is measured for the N points simultaneously, the external magnetic field $B_{EX}$ may be measured in a divided manner several times.

The above is the configuration of the test apparatus 100. Next, description will be made regarding the advantages of the test apparatus 100.

With this, the magnetization detection units 172 formed on the diagnostic wafer 170 are positioned at the same height at that of the devices under test 12 formed on the wafer under test 10. Accordingly, the external magnetic field $B_{EX}$ to be applied to the devices under test 12 formed on the wafer under test 10 can be measured with high precision by means of the magnetization detection units 172 formed on the diagnostic wafer 170.

The magnetization detection units 172 can be integrally formed on the diagnostic wafer 170 using a semiconductor process. This allows the magnetization detection units 172 to be arranged with a higher density than that of conventional commercially available magnetization probes. Accordingly, with the N magnetization detection units 172, this arrangement allows the external magnetic field $B_{EX}$ generated by the magnetic field application apparatus 140 to be measured at many points, thereby allowing the intensity distribution thereof to be acquired.

With a method using a conventional commercially available magnetization probe, such a magnetization probe requires a dedicated measurement device. Accordingly, in a case in which the output of the measurement device is to be acquired by the tester main body 110, the user is required to build a complicated test system. In contrast, with the present embodiment, an electrical signal acquired from each magnetization detection unit 172 can be processed using a hardware component built into the test head 120, i.e., using a standard hardware component provided to the test apparatus 100. Furthermore, this allows the tester main body 110 to directly process the data with respect to the magnetization distribution thus acquired.

Next, description will be made regarding modifications relating to the embodiment 2.

Modification 1

Figure 8:
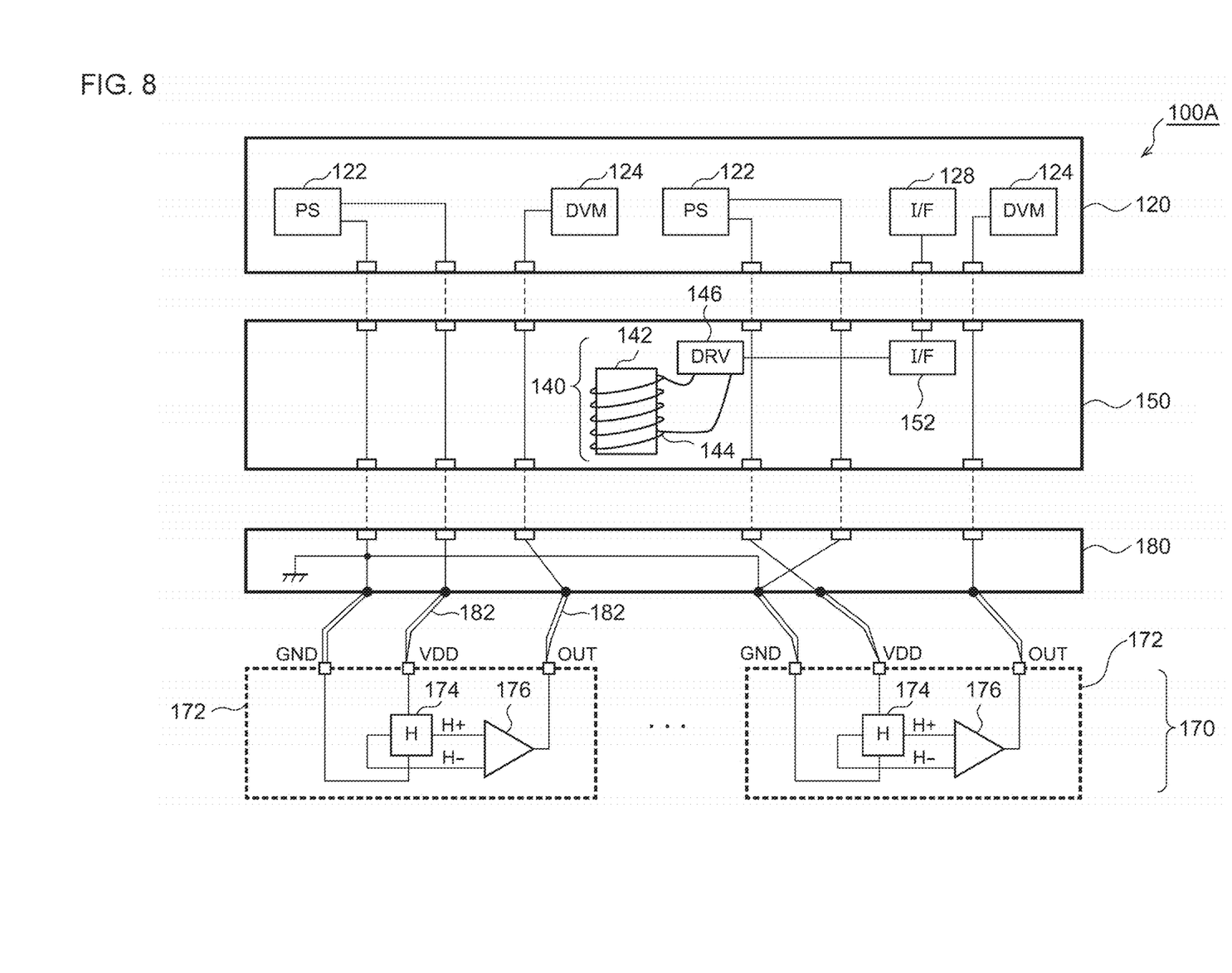
FIG. 8 is a diagram showing a test apparatus according to a modification 1.

FIG. 8 is a diagram showing a test apparatus 100A according to a modification 1. In the diagnostic probe card 180 according to the modification 1, the GND pins of the multiple magnetization detection units 172 are coupled to each other and grounded to a common ground. With the diagnostic probe card 180 in which the GND pins are short-circuited, this allows the impedance to be reduced, thereby providing improved noise resistance.

Modification 2

Figure 9:
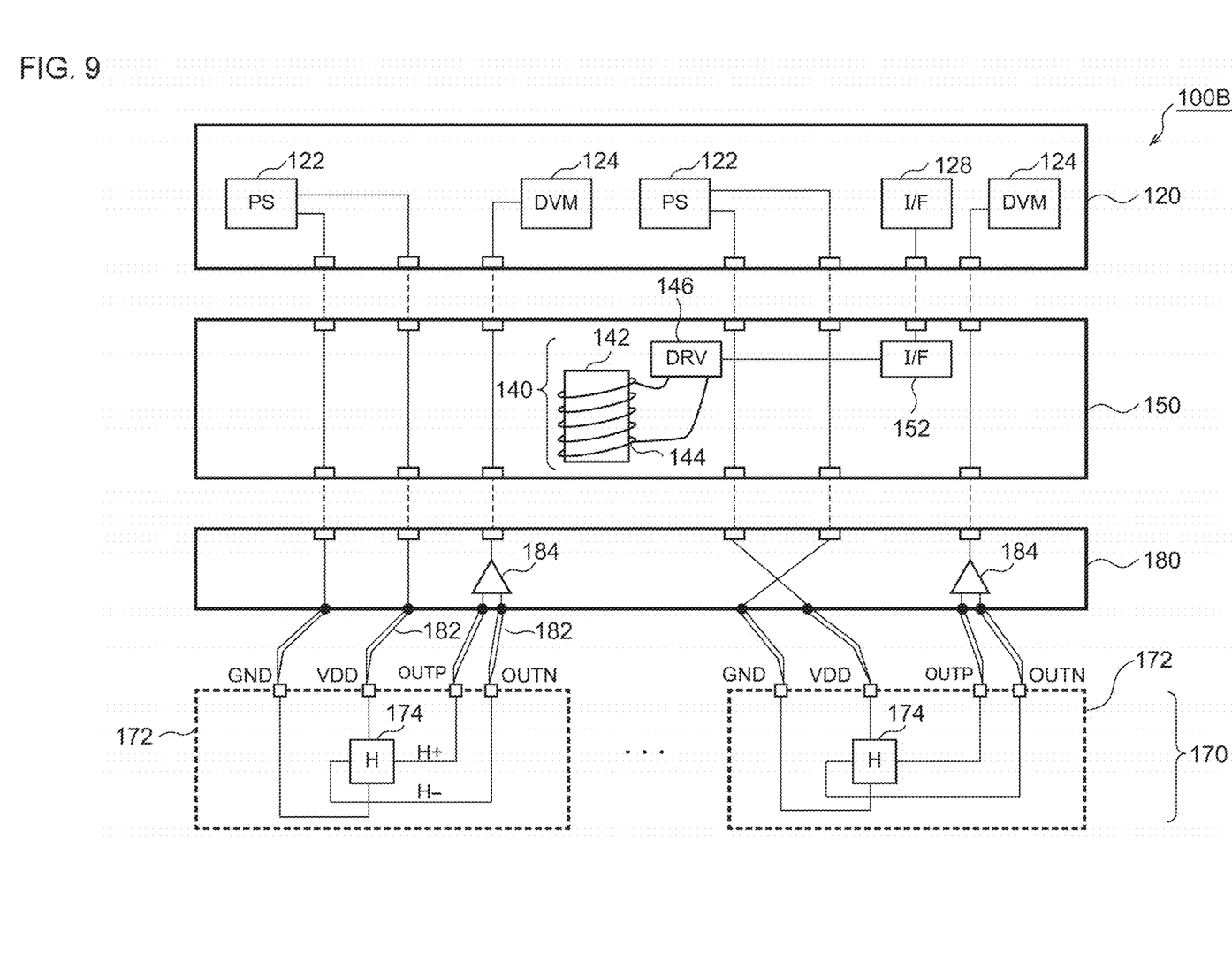
FIG. 9 is a diagram showing a test apparatus according to a modification 2.

FIG. 9 is a diagram showing a test apparatus 100B according to a modification 2. Each magnetization detection unit 172 includes a magnetic sensor 174, a power supply pin VDD, a ground pin GND, and a pair of output pins OUTP and OUTN. A pair of a positive electrical signal H+ and a negative electrical signal H− generated by the magnetic sensor 174 are supplied to the diagnostic probe card 180 via the output pins OUTP and OUTN. In this example, the magnetic sensor 174 is configured as a Hall element. The diagnostic probe card 180 is provided with an amplifier 184 that amplifies the difference between the electrical signals H+ and H−. The output of the amplifier 184 is supplied to and acquired by the DVM 124 via the wafer connection HiFix 150.

The modification 1 described above has an advantage of a reduced number of the probe needles 182 as compared with the modification 2. In contrast, with the modification 2, a discrete component can be employed as the amplifier 184. This allows amplifiers with more stable and/or higher performance to be employed as compared with the amplifiers 176 integrated on the diagnostic wafer 170.

Modification 3

Figure 10:
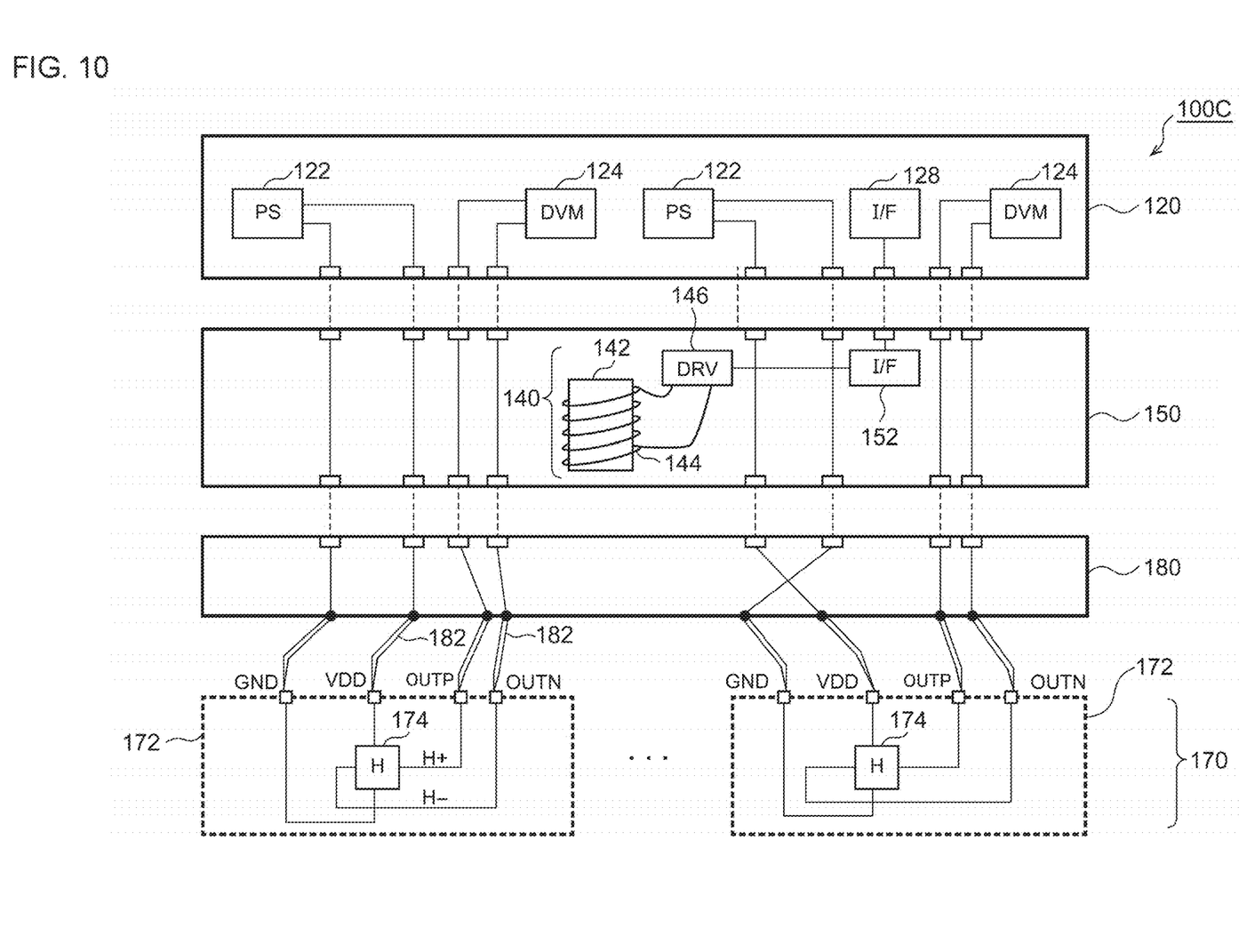
FIG. 10 is a diagram showing a test apparatus according to a modification 3.

FIG. 10 is a diagram showing a test apparatus 100C according to a modification 3. Each magnetization detection unit 172 has the same configuration as that in the modification 2. In the modification 3, a pair of a positive electrical signal H+ and a negative electrical signal H− generated by the magnetic sensor 174 are supplied to and acquired by the DVM 124 via the output pins OUTP and OUTN, the diagnostic probe card 180, and the wafer connection HiFix 150. The modification 3 is effectively employed for a platform in which the Hall signals H+ and H− are acquired with a sufficiently large signal level and with a high S/N ratio.

Modification 4

Figure 11A:
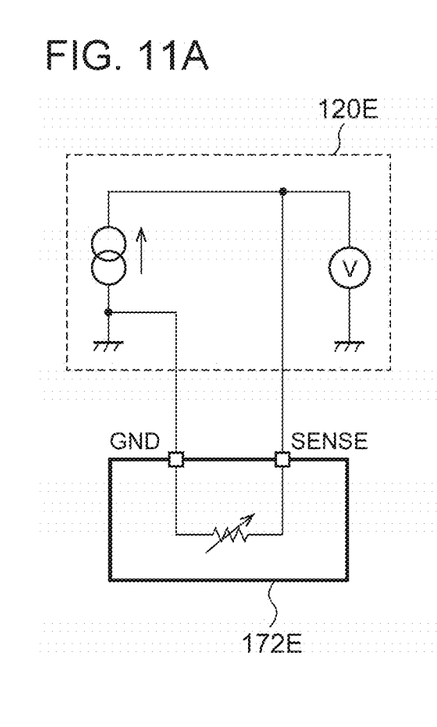
FIG. 11A through FIG. 11C are circuit diagrams each showing a magnetization detection unit and a test head according to a modification 4.
Figure 11B:
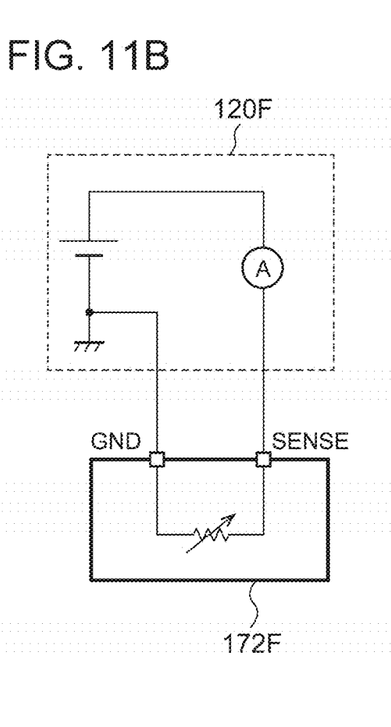
Figure 11C:
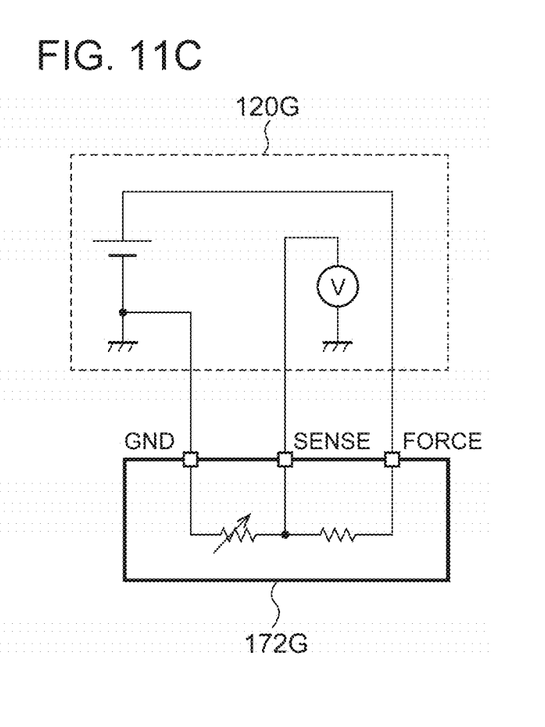

As the magnetic sensor 174, instead of the Hall element, the magnetization detection unit 172 may be provided with a magnetic resistance (MR) sensor having a resistance that changes according to the magnetic field. FIG. 11A through FIG. 11C are circuit diagrams each showing the magnetization detection unit 172 and the test head 120 according to a modification 4. Magnetization detection units 172E and 172F shown in FIG. 11A and FIG. 11B each include a MR element 178. The test head 120E shown in FIG. 11A detects the change in the resistance value of the MR element 178 by current application and voltage measurement. The test head 120F shown in FIG. 11B detects the change in the resistance value of the MR element 178 by voltage application and current measurement. The magnetization detection unit 172G shown in FIG. 11C includes a resistor 179 in addition to the MR element 178. The test head 120G applies a constant voltage between the FORCE pin and the GND pin, and measures the voltage that occurs at the SENSE pin. The resistor 179 may be provided to the diagnostic probe card 180.

Modification 5

Description has been made in the embodiment regarding an arrangement in which the wafer under test 10 is measured in a divided manner. Also, the present disclosure is applicable to a Full Wafer Contact method. In this case, the magnetic field application apparatus 140 is configured to be capable of applying a uniform magnetic field over the entire face of the wafer under test 10.

Modification 6

Figure 12:
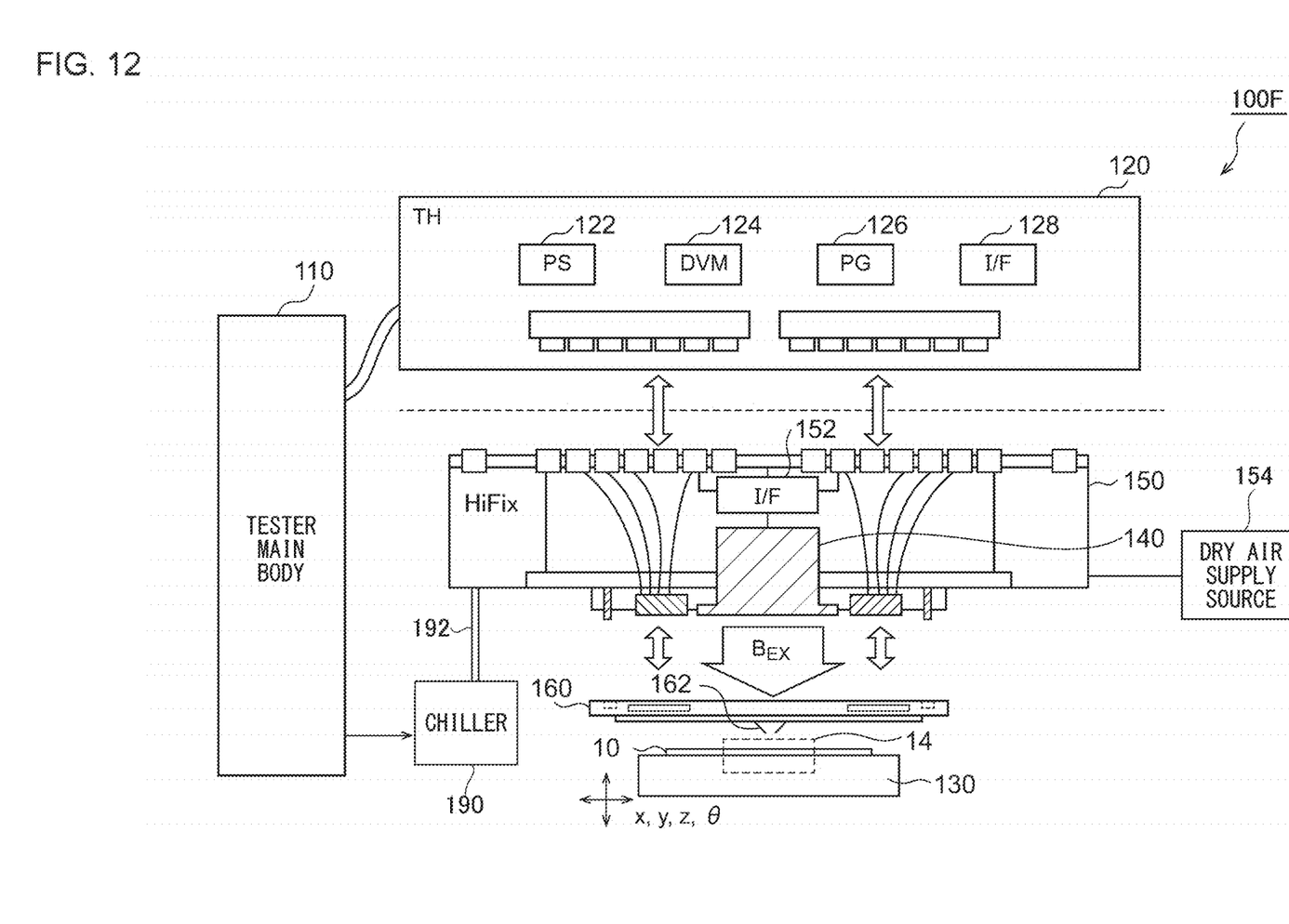
FIG. 12 is a diagram showing a test apparatus according to a modification 6.

FIG. 12 is a diagram showing a test apparatus 100F according to a modification 6. In some cases, a temperature control mechanism is built into the stage 130. In some cases, in-vehicle devices are required to operate in a temperature range between −50° C. and 170° C. In this case, the stage 130 is cooled to a temperature of −50° C. to −70° C. In a case in which the temperature of the wafer connection HiFix 150 is reduced as a result of cooling the stage 130, such an arrangement has the potential to cause the occurrence of condensation. In order to solve such a problem, a dry air supply source is configured to supply dry air to the wafer connection HiFix 150.

The magnetic field application apparatus 140 acts as a heat source. It is not desirable for the heat thereof to have an effect on the test probe card 160 or the stage 130. In a case in which air-cooling using dry air alone is insufficient, a cooling chiller 190 is provided so as to cool the wafer connection HiFix 150. This allows the thermal effects on the test probe card 160 and the stage 130 to be reduced.

Figure 13:
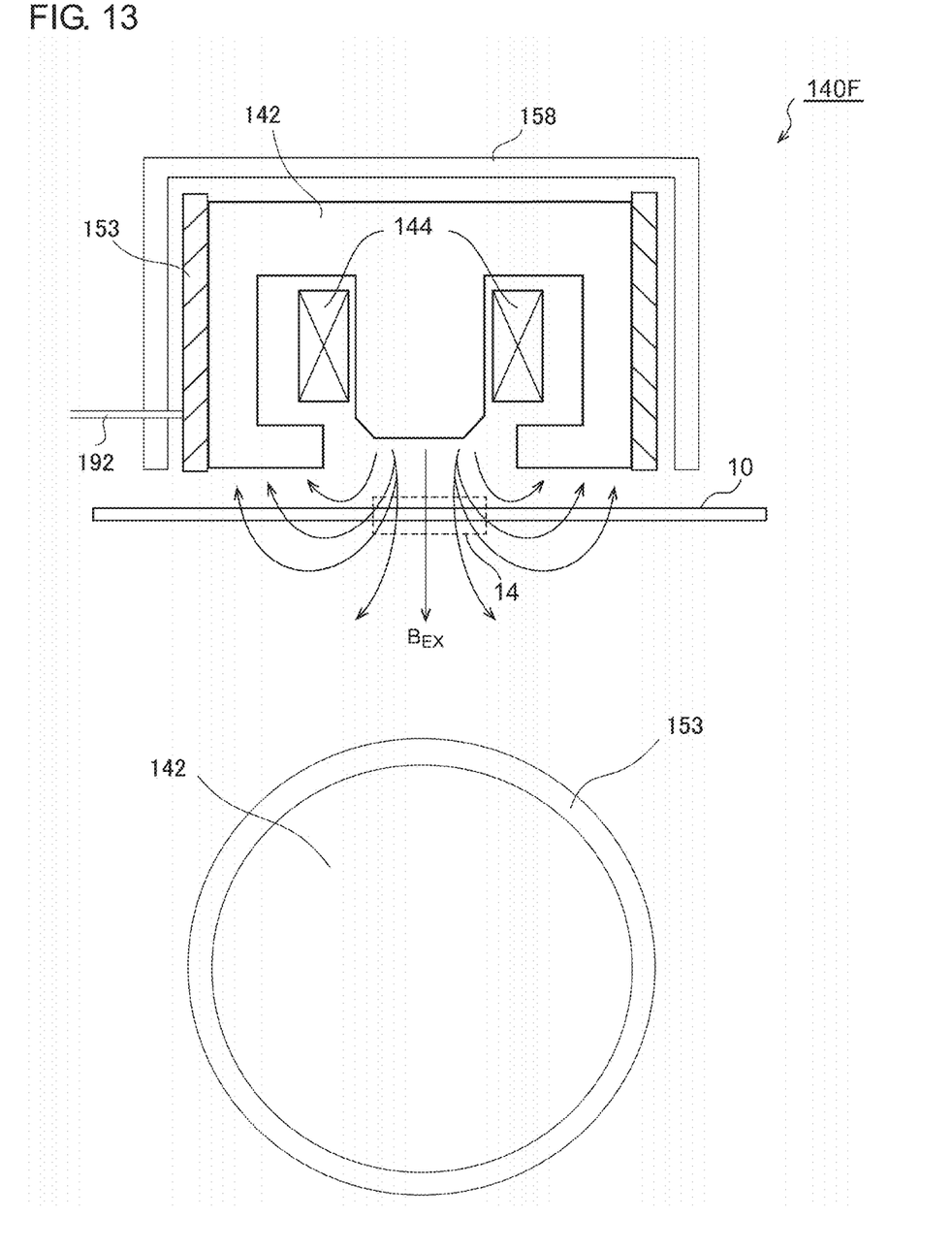
FIG. 13 is a diagram showing an example configuration of the magnetic field application apparatus.

FIG. 13 is a diagram showing an example configuration of a magnetic field application apparatus 140F. The magnetic field application apparatus 140F is provided with a cooling mechanism 156 thermally coupled to the core 142 in a state in which they are closely in contact with each other. The cooling mechanism 156 is configured such that a cooling medium flows through an internal space of the cooling mechanism 156 via a cooling medium pipe 192. With this, the cooling medium is discharged from the cooling mechanism 156 via the cooling medium pipe 192 after it has drawn heat in the internal space of the cooling mechanism 156.

With such an arrangement in which the wafer connection HiFix 150 is cooled, this is capable of preventing the occurrence of a burn injury or the like suffered by an operator when the operator touches the wafer connection HiFix 150.

Furthermore, the magnetic field application apparatus 140 generates an undesired leakage magnetic field in addition to the external magnetic field $B_{EX}$ to be applied to the wafer under test 10. The leakage magnetic field has the potential to cause adverse effects on the wafer under test 10, the test apparatus 100 itself, and devices and people in the vicinity. In order to solve such a problem, as shown in FIG. 13, the magnetic field application apparatus 140F is provided with a magnetic field shielding mechanism 158 that shields the leakage magnetic field.

Modification 7

Description has been made in the embodiments regarding an arrangement in which a control signal for the magnetic field application apparatus 140 is transmitted by communication between the interface circuit 128 of the test head 120 and the interface circuit 152 of the wafer connection HiFix 150. However, the present invention is not restricted to such an arrangement. Also, the control signal may be transmitted via another path.

Also, an additional controller may be provided for the magnetic field application apparatus 140. Also, the tester main body 110 may supply a control signal to the controller, and the controller may control the magnetic field generated by the magnetic field application apparatus 140.

Also, from among the components of the magnetic field application apparatus 140, the core 142 and the coil 144, which are configured as main parts, may preferably be built into the wafer connection HiFix 150. On the other hand, the driving circuit 146 configured as a peripheral circuit may be provided as an external component of the wafer connection HiFix 150. In this case, the tester main body 110 may be configured to control the driving circuit 146.

While the preferred embodiments of the present disclosure have been described using specific terms, such description is for illustrative purposes only, and it is to be understood that changes and variations may be made without departing from the spirit or scope of the appended claims.

What is claimed is:

1. A test apparatus structured to test a wafer under test on which devices under test each comprising magnetoresistive memory or a magnetic sensor are formed, the test apparatus comprising:
    a test head;
    a stage on which the wafer under test is to be mounted in a test process;
    a connection unit structured to be coupled to the test head;
    a test probe card structured to be detachably coupled to the connection unit and to make probe contact with the wafer under test in the test process; and
    a magnetic field application apparatus provided to the connection unit and structured to apply a magnetic field to the wafer under test through the test probe card in the test process.

2. The test apparatus according to claim 1, wherein the magnetic field application apparatus comprises:
    a core;
    a coil wound on the core; and
    a driving circuit structured to drive the coil,
    and wherein the connection unit further comprises an interface circuit structured to receive a control signal for the driving circuit from the test head, and wherein the interface circuit is an existing interface.

3. The test apparatus according to claim 1, wherein the magnetic field application apparatus comprises:
    a core; and
    a coil wound on the core, and wherein a driving circuit structured to drive the coil is provided as an external component of the connection unit.

4. The test apparatus according to claim 1, further comprising:
   a diagnostic wafer structured to be mounted on the stage instead of the wafer under test in a diagnostic process of the test apparatus, wherein a plurality of magnetization detection units are formed on the diagnostic wafer, and the diagnostic wafer is structured to measure a magnetic field generated by the magnetic field application apparatus by means of each magnetization detection unit in the diagnostic process; and
   a diagnostic probe card to be used in the diagnostic process instead of the test probe card, and structured to make probe contact with the diagnostic wafer.

* * * * *